United States Patent
Edo et al.

(10) Patent No.: US 10,065,824 B2
(45) Date of Patent: Sep. 4, 2018

(54) STACKING APPARATUS (71) Applicants: Yousuke Edo, Kanagawa (JP);
Yasufumi Takahashi, Kanagawa (JP);
Yasuo Niikura, Kanagawa (JP); Satoru
Takano, Kanagawa (JP); Hidehiko
Fujiwara, Tokyo (JP); Takeshi Akai,
Kanagawa (JP); Yasunori Hino,
Kanagawa (JP); Tadashi Matsuoka,
Kanagawa (JP); Atsunori Yoshida,
Kanagawa (JP); Ryo Kanno, Kanagawa
(JP); Hikaru Fukasawa, Kanagawa
(JP); Hiroshi Komuro, Kanagawa (JP);
Masaru Yamagishi, Kanagawa (JP);
Toshihiro Shimada, Tokyo (JP);
Satoshi Aizawa, Tokyo (JP); Kenji
Ishii, Kanagawa (JP)

(72) Inventors: Yousuke Edo, Kanagawa (JP);
Yasufumi Takahashi, Kanagawa (JP);
Yasuo Niikura, Kanagawa (JP); Satoru
Takano, Kanagawa (JP); Hidehiko
Fujiwara, Tokyo (JP); Takeshi Akai,
Kanagawa (JP); Yasunori Hino,
Kanagawa (JP); Tadashi Matsuoka,
Kanagawa (JP); Atsunori Yoshida,
Kanagawa (JP); Ryo Kanno, Kanagawa
(JP); Hikaru Fukasawa, Kanagawa
(JP); Hiroshi Komuro, Kanagawa (JP);
Masaru Yamagishi, Kanagawa (JP);
Toshihiro Shimada, Tokyo (JP);
Satoshi Aizawa, Tokyo (JP); Kenji
Ishii, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 12 days.

(21) Appl. No.: 15/374,380

(22) Filed: Dec. 9, 2016

(65) Prior Publication Data
US 2017/0174462 A1 Jun. 22, 2017

(30) Foreign Application Priority Data

Dec. 16, 2015 (JP) .................................. 2015-245701
Oct. 18, 2016 (JP) .................................. 2016-204653

(51) Int. Cl.
*B65H 29/04* (2006.01)
*B65H 29/18* (2006.01)
(Continued)

(52) U.S. Cl.
CPC ............. *B65H 29/18* (2013.01); *B65H 29/12* (2013.01); *B65H 29/70* (2013.01); *B65H 33/04* (2013.01);
(Continued)

(58) Field of Classification Search
CPC .... B65H 29/6681; B65H 29/70; B65H 33/04; B65H 29/12; B65H 2701/18264; B65H 2701/1928; B65H 3/44; B65H 2301/4213
See application file for complete search history.

(56) References Cited

U.S. PATENT DOCUMENTS 5,788,229 A * 8/1998 Asami .................... B65H 29/70
271/188
5,961,274 A * 10/1999 Bors ...................... B65G 57/06
414/789.6

(Continued)

FOREIGN PATENT DOCUMENTS

JP 08-225217 9/1996
JP 2002-241013 8/2002

OTHER PUBLICATIONS

U.S. Appl. No. 15/163,850, filed May 25, 2016.
(Continued)

Primary Examiner — Jeremy R Severson
(74) Attorney, Agent, or Firm — Oblon, McClelland, Maier & Neustadt, L.L.P.

(57) ABSTRACT

A stacking apparatus includes a conveyance unit, a stacking unit, and a separation member supply unit. The conveyance (Continued)

unit conveys sheets for circuit board. The stacking unit stacks the sheets. The separation member supply unit supplies a separation member to separate the stacked sheets at any position. The separation member supply unit places the separation member on the sheet in being conveyed.

16 Claims, 7 Drawing Sheets (51) Int. Cl.
  *B65H 33/04*   (2006.01)
  *B65H 29/70*   (2006.01)
  *B65H 29/12*   (2006.01)
(52) U.S. Cl.
  CPC .............. *B65H 2701/18264* (2013.01); *B65H 2701/19* (2013.01)

(56) References Cited

U.S. PATENT DOCUMENTS

| | | | |
|---|---|---|---|
| 7,744,079 B2 * | 6/2010 | Van Netten | B65H 5/023 271/202 |
| 7,909,157 B2 * | 3/2011 | Giuliani | B65B 9/067 198/418.4 |
| 2002/0127039 A1 | 9/2002 | Yamagishi | |
| 2006/0087073 A1 | 4/2006 | Yamagishi | |
| 2006/0164456 A1 | 7/2006 | Yamagishi et al. | |
| 2008/0012208 A1 | 1/2008 | Fujiwara et al. | |
| 2008/0298873 A1 | 12/2008 | Yamagishi | |
| 2009/0051101 A1 | 2/2009 | Yamagishi | |
| 2009/0257846 A1 | 10/2009 | Matsushita et al. | |
| 2009/0296093 A1 | 12/2009 | Yamagishi | |
| 2010/0225053 A1 | 9/2010 | Nakamura et al. | |
| 2010/0239282 A1 | 9/2010 | Ashikawa et al. | |
| 2012/0002252 A1 | 1/2012 | Kubo et al. | |
| 2012/0153556 A1 | 6/2012 | Sugiyama et al. | |
| 2012/0267846 A1 | 10/2012 | Nakada et al. | |
| 2012/0282004 A1 | 11/2012 | Furuhashi et al. | |
| 2013/0113154 A1 | 5/2013 | Furuhashi et al. | |
| 2013/0134659 A1 | 5/2013 | Konno et al. | |
| 2013/0147105 A1 | 6/2013 | Sugiyama et al. | |
| 2013/0175755 A1 | 7/2013 | Machida et al. | |
| 2013/0215481 A1 | 8/2013 | Hayasaka et al. | |
| 2013/0228965 A1 | 9/2013 | Hoshino et al. | |
| 2013/0236228 A1 | 9/2013 | Nagasako et al. | |
| 2013/0242359 A1 | 9/2013 | Heishi et al. | |
| 2013/0320611 A1 | 12/2013 | Kubo et al. | |
| 2014/0011656 A1 | 1/2014 | Niikura et al. | |
| 2014/0131938 A1 | 5/2014 | Satoh et al. | |
| 2014/0140744 A1 | 5/2014 | Akai et al. | |
| 2014/0145395 A1 | 5/2014 | Takano et al. | |
| 2014/0159301 A1 | 6/2014 | Suzuki et al. | |
| 2014/0203501 A1 | 7/2014 | Hoshino et al. | |
| 2014/0239573 A1 | 8/2014 | Akai et al. | |
| 2015/0045197 A1 | 2/2015 | Sugiyama et al. | |
| 2015/0065326 A1 | 3/2015 | Musha et al. | |
| 2015/0091246 A1 | 4/2015 | Yoshida et al. | |
| 2015/0093214 A1 | 4/2015 | Takahashi et al. | |
| 2015/0166280 A1 | 6/2015 | Hino et al. | |
| 2015/0225191 A1 | 8/2015 | Niikura et al. | |
| 2015/0253716 A1 | 9/2015 | Nagasako et al. | |
| 2015/0360899 A1 | 12/2015 | Takahashi et al. | |
| 2016/0016740 A1 | 1/2016 | Niikura et al. | |
| 2016/0026125 A1 | 1/2016 | Ishii et al. | |
| 2016/0107853 A1 | 4/2016 | Hashimoto et al. | |
| 2016/0107854 A1 | 4/2016 | Hashimoto et al. | |
| 2016/0122144 A1 | 5/2016 | Fukumoto et al. | |
| 2016/0170355 A1 | 6/2016 | Heishi et al. | |
| 2016/0185552 A1 | 6/2016 | Hoshino et al. | |
| 2016/0221787 A1 | 8/2016 | Matsushita et al. | |
| 2016/0264370 A1 | 9/2016 | Okutsu et al. | |

OTHER PUBLICATIONS

U.S. Appl. No. 15/150,499, filed May 10, 2016.
U.S. Appl. No. 15/153,840, filed May 13, 2016.
U.S. Appl. No. 15/258,342, filed Sep. 7, 2016.
U.S. Appl. No. 15/276,894, filed Sep. 27, 2016.

\* cited by examiner

STACKING APPARATUS

CROSS-REFERENCE TO RELATED APPLICATIONS

The present application claims priority under 35 U.S.C. § 119 to Japanese Patent Application No. 2015-245701, filed on Dec. 16, 2015 and Japanese Patent Application No. 2016-204653, filed on Oct. 18, 2016. The contents of which are incorporated herein by reference in their entirety.

BACKGROUND OF THE INVENTION

1. Field of the Invention

The present invention relates to a stacking apparatus.

2. Description of the Related Art

Apparatuses are known that convey and stack sheets for circuit board required to be handled with care because of their characteristics of vulnerability, flexibility, and ignitability, for example. A technique has been disclosed in which a prepreg material is used for sheets for circuit board, for example. An apparatus is known that can mark a boundary between the stacks each of a certain number of prepreg sheets, by changing a stacking position of the prepreg sheets for every certain number of prepreg sheets.

For example, Japanese Unexamined Patent Application Publication No. 2002-241013 discloses a technique in which prepreg sheets are gripped with clamps and moved on a stacking table and thereafter the clamps are released. According to this publication, the boundary between stacks each of the certain number of prepreg sheets can be marked by changing a position where the clamps are released. Further, Japanese Unexamined Patent Application Publication discloses a technique in which a position of a guide member provided on a stacking table is moved every time the certain number of prepreg sheets are stacked. Still further, as a method for marking a boundary between the stacks each of the certain number of sheets for circuit board, another technique is known in which a separation member is placed as a boundary.

The conventional techniques, however, cause the sheets for circuit board to be scratched or deformed by unnecessary force applied thereto in a process to mark a boundary between the stacks each of the certain number of sheets for circuit board in some cases. It is, thus, conventionally difficult to make it possible to mark a boundary between the stacks each of the certain number of sheets for circuit board without scratching and deforming the sheets.

SUMMARY OF THE INVENTION

According to one aspect of the present invention, a stacking apparatus includes a conveyance unit, a stacking unit, and a separation member supply unit. The conveyance unit conveys sheets for circuit board. The stacking unit stacks the sheets. The separation member supply unit supplies a separation member to separate the stacked sheets at any position. The separation member supply unit places the separation member on the sheet in being conveyed.

BRIEF DESCRIPTION OF THE DRAWINGS

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENT

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

An embodiment of the present invention will be described in detail below with reference to the drawings.

An object of an embodiment is to provide a stacking apparatus that makes it possible to mark a boundary between stacks each of the certain number of sheets for circuit board without scratching and deforming the sheets.

Figure 1:
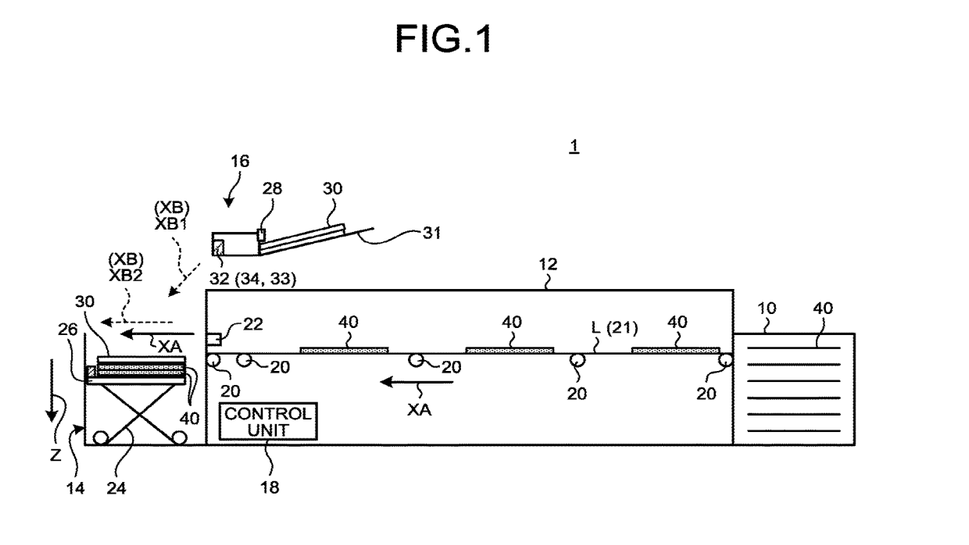
FIG. 1 is a schematic diagram illustrating an exemplary structure of a stacking apparatus.

FIG. 1 is a schematic diagram illustrating a structure of a stacking apparatus 1. The stacking apparatus 1 conveys and stacks sheets for circuit board. The stacking apparatus 1 in the embodiment stacks the sheets for circuit board with separation members 30 each placed between the sheets for circuit board for every certain number of sheets.

In the embodiment, the sheets for circuit board are prepregs 40. The prepreg 40 is an example of the sheet for circuit board. The sheets for circuit board stacked by the stacking apparatus 1 are not limited to the prepregs 40.

Specifically, the sheets for circuit board are capable of being conveyed and stacked by the stacking apparatus 1. The shape of the sheet for circuit board is not limited to a specific shape. The sheet for circuit board may have any shape such as a sheet shape or a three-dimensional shape. In the embodiment, the sheet for circuit board has a sheet shape, as an example.

The stacking apparatus 1 in the embodiment is particularly useful for stacking the sheets for circuit board having the following characteristics. Specifically, the sheets for circuit board are preferably required to be handled with care in conveyance and stacking of them because of their characteristics of vulnerability, ignitability, and flexibility, for example. The sheet for circuit board preferably has the following characteristics: wear resistance lower than the separation member 30; ignitability higher than the separation member 30; and flexibility higher than the separation member 30, for example.

The prepreg 40 is a semi-cured member having a sheet shape. It is known that such prepreg 40 has low wear resistance (is easily scratched), high ignitability, and high flexibility. When the prepreg 40 is used for the sheet for circuit board, the circuit board manufactured using the scratched sheet causes a deterioration of an electrical characteristic (resistance value). When the prepreg sheets are used for sheets for the circuit board, the prepreg members, thus, need to be conveyed and stacked without causing the deterioration of the electrical characteristic (resistance value).

The prepregs 40 are members that have a sheet shape and are required to be conveyed and stacked with care from the viewpoints of prevention from being scratched, prevention from igniting, prevention from being folded or bent, and prevention of deterioration of the electrical characteristic, for example.

In the embodiment, the prepreg 40 is a member that is cut or formed into a certain size to have a rectangular sheet shape.

The following describes the separation member 30. The separation member 30 is a member to separate the stacked prepregs 40 at any position. The separation member 30 has a role to separate the prepregs 40 for every certain number of prepregs 40 by being interposed between the prepregs 40.

The separation member 30 preferably differs from the prepreg 40 in least one of a thickness, a size, a color, and a material from the viewpoint of being distinguished from the prepreg 40 visually or in a tactile manner.

Particularly, from the viewpoint of being easily and visually distinguished from each other, the separation member 30 and the prepreg 40 preferably have different colors from each other.

The separation member 30 is preferably made of the same material as prepreg 40. In this case, the separation member 30 may differ from the prepreg 40 in at least one of a thickness, a size, or a color. The separation members 30 and the prepregs 40 that have the same material prevent deterioration in quality of the prepregs 40 caused by the separation members 30 when the separation members 30 and the prepreg 40 overlap with each other in stacking.

In the embodiment, the separation member 30 is a member that has a rectangular sheet shape. In this case, at least one width of the separation member 30 is preferably equal to at least one width of the prepreg 40. The width is each of the length in a conveyance direction (a conveyance direction XA in FIG. 1) of the prepreg 40 and the length in a direction perpendicular to the conveyance direction XA, in each of the prepreg 40 and the separation member 30.

When at least one width of the separation member 30 is equal to at least one width of the prepreg 40, at least one of the conveyance step or the stacking step in the stacking apparatus 1 can be simplified.

When one width of the separation member 30 differs from one width of the prepreg 40, the length (width) in the conveyance direction XA of the separation member 30 stacked in the stacking apparatus 1 and the length (width) in the conveyance direction XA of the prepreg 40 stacked in the stacking apparatus 1 may differ from each other. In this case, the length (width) of the separation member 30 in the conveyance direction XA is preferably larger than the length (width) of the prepreg 40 in the conveyance direction XA. This case makes it possible to easily know the position of the separation member 30 in the stack in which the separation members 30 and the prepregs 40 are stacked.

The thickness of the separation member 30 is not limited to any specific thickness. The separation member 30 preferably has a thickness smaller than that of the prepreg 40.

The separation member 30 is not limited to any specific type. Any type may be used that satisfies the characteristics described above. The separation member 30 is preferably dust-free paper from the viewpoint of preventing the prepreg 40 from adherence of adhering substances such as dust.

The following describes a structure of the stacking apparatus 1. The stacking apparatus 1 includes a conveyance unit 12, a separation member supply unit 16, and a control unit 18.

The prepreg 40 is supplied from a supply unit 10 to the conveyance unit 12. The supply unit 10 sequentially supplies the prepregs 40 to the conveyance unit 12. The supply unit 10 is not limited to any specific mechanism as long as the supply unit 10 can supply the prepregs 40. The supply unit 10 may be a mechanism that automatically supplies the prepregs 40 having a sheet shape or a mechanism that cuts the prepreg formed in a roll shape and supplies the prepreg sheets after cutting. The supply unit 10 may be a mechanism that supplies the prepregs 40 by manual feeding. The supply unit 10 may be a combination of at least two or more of the mechanisms (of the automatic supply, the supply after cutting, and the supply by manual feeding).

The conveyance unit 12 conveys the prepreg 40 supplied from the supply unit 10 and discharges the prepreg 40 to a discharge unit 14. The conveyance unit 12 includes conveyance rollers 20, a conveyance belt 21, and a sensor 22, for example. The conveyance belt 21 is disposed along a conveyance path L for the prepreg 40. The conveyance belt 21 is a belt member that conveys the prepreg 40 while holding the prepreg 40 on an outer periphery thereof. The conveyance belt 21 is not limited to the belt member. The conveyance belt 21 is conveyed in the conveyance direction XA by the multiple conveyance rollers 20. With the conveyance of the conveyance belt 21, the prepreg 40 held on the conveyance belt 21 is conveyed in the conveyance direction XA, and discharged to the discharge unit 14.

The sensor 22 detects the prepreg 40 discharged from the conveyance unit 12 to the discharge unit 14. A known sensor may be used for the sensor 22. For every new detection of the prepreg 40, the sensor 22 transmits a detection signal of the prepreg 40 (hereinafter, it is described as a prepreg detection signal in some cases) to the control unit 18.

The discharge unit 14 stacks the prepregs 40 discharged from the conveyance unit 12. The separation member 30 is supplied from the separation member supply unit 16 to the discharge unit 14.

The discharge unit 14 includes a stacking unit 26. The stacking unit 26 is a table that supports the prepregs 40 discharged from the conveyance unit 12. The stacking unit 26 stacks the prepregs 40 discharged from the conveyance unit 12. The prepregs 40 discharged from the conveyance unit 12 are stacked on the stacking unit 26.

The stacking unit 26 is supported by a supporting member 24. The supporting member 24 supports the stacking unit 26 in such a manner that the stacking unit 26 moves downwards in the vertical direction (refer to the Z direction indicated with the arrow) in accordance with a total weight of the prepregs 40 and the separation members 30 that are stacked on the stacking unit 26.

Figure 2:
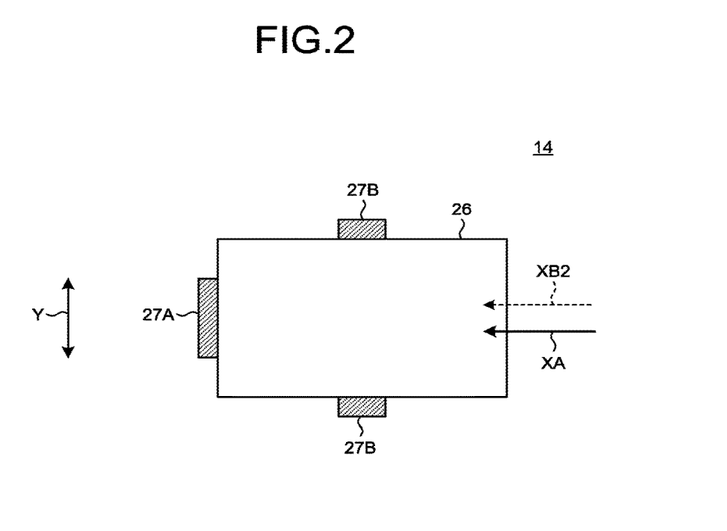
FIG. 2 is an exemplary top view of a stacking unit.

FIG. 2 is an exemplary top view of the stacking unit 26. The stacking unit 26 is provided with a guide member 27A and a pair of abutment stop members 27B. The guide member 27A is disposed at an end of the stacking unit 26 on a downstream side in the conveyance direction XA (and a supply direction XB2, which is described in detail later). The guide member 27A aligns the positions of the respective prepregs 40 and separation members 30 that are stacked on the stacking unit 26 at the end on the downstream side in the conveyance direction XA (and the supply direction XB2).

The abutment stop members 27B align the positions of the respective prepregs 40 and separation members 30 that are stacked on the stacking unit 26 in a direction (refer to the Y direction indicated with the arrow in FIG. 2) perpendicular to the conveyance direction XA (the supply direction XB2). The abutment stop members 27B are called joggers in some cases.

The prepreg 40 discharged from the conveyance unit 12 comes into contact with the guide member 27A at the end of the prepreg 40 on the downstream side in the conveyance direction XA on the stacking unit 26. As a result, the positions of the ends of the respective prepregs 40 stacked on the stacking unit 26 on the downstream side in the conveyance direction XA are aligned. In the same manner as the prepregs 40, the positions of the ends of the respective separation members 30 discharged to the stacking unit 26 on the downstream side in the conveyance direction XA are aligned.

By the pair of abutment stop members 27B, the positions of the respective prepregs 40 and separation members 30 that are stacked on the stacking unit 26 are aligned in the direction (refer to the Y direction indicated with the arrow in FIG. 2) perpendicular to the conveyance direction XA (the supply direction XB2). The discharge unit 14 is not limited to any specific mechanism as long as the discharge unit 14 can stack the prepregs 40 discharged from the conveyance unit 12.

Referring back to FIG. 1, the following describes the separation member supply unit 16. The separation member supply unit 16 is a mechanism that interposes the separation member 30 between the prepregs 40. The separation member supply unit 16 discharges the separation member 30 to the discharge unit 14 for every discharge of the certain number of prepregs 40 to the stacking unit 26 from the conveyance unit 12.

Figure 3:
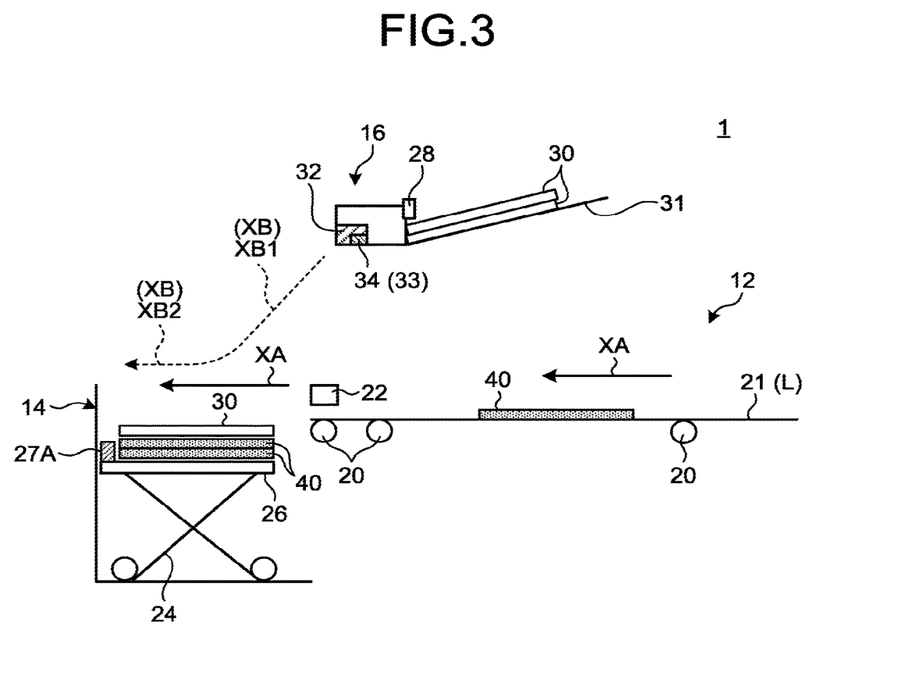
FIG. 3 is an enlarged schematic diagram of an interposing mechanism.

FIG. 3 is an enlarged schematic diagram of a part including the separation member supply unit 16 in the stacking apparatus 1. In the embodiment, the separation member supply unit 16 includes a supporting plate 31, a separation member supply section 32, and a sensor 28. The supporting plate 31 holds the separation members 30. The sensor 28 detects whether the separation member 30 is placed on the supporting plate 31. The sensor 28 is a known sensor. Once detecting the separation member 30, the sensor 28 transmits a detection signal of the separation member 30 (hereinafter, it is described as a separation member detection signal in some cases) to the control unit 18.

The separation member supply section 32 supplies the separation member 30 to the stacked prepregs 40.

In the embodiment, the separation member supply section 32 supplies the separation member 30 onto the prepregs 40. In the embodiment, the separation member supply section 32 is disposed on the upstream side of the stacking unit 26 included in the discharge unit 14 in the conveyance direction XA of the prepreg 40. Because of this arrangement, in the embodiment, the separation member supply section 32 supplies the separation member 30 onto the prepregs 40 stacked on the stacking unit 26 in the discharge unit 14.

The separation member 30 supplied by the separation member supply section 32 from the separation member supply unit 16 is supplied in the supply direction XB and reaches the top of the prepregs 40 stacked on the stacking unit 26.

The conveyance direction XA of the prepreg 40 and the supply direction XB of the separation member 30 preferably coincide with each other. The separation member 30 supplied by the separation member supply section 32 is supplied while falling downwards by the gravitational effect (refer to a supply direction XB1). The separation member 30 moves in substantially horizontal direction above the top of the prepregs 40 (refer to a supply direction XB2), and thereafter is placed on the prepreg 40 in such a manner that the lower surface of the separation member 30 and the upper surface of the prepreg 40 are in surface contact with each other.

The fact that the conveyance direction XA and the supply direction XB coincide with each other specifically means that the conveyance direction XA of the prepreg 40 when the prepreg 40 is discharged above the stacking unit 26 and the supply direction XB2 of the separation member 30 when the separation member 30 moves in substantially horizontal direction above the prepreg 40 coincide with each other.

As a result of the conveyance direction XA of the prepreg 40 and the supply direction XB of the separation member 30 coinciding with each other, the lower surface of the separation member 30 and the upper surface of the prepreg 40 are prevented from rubbing with each other in the conveyance of the prepreg 40. The structure makes it possible to mark a boundary between the stacks each of the certain number of prepregs 40 without scratching and deforming the prepregs 40.

A conveyance speed of the prepreg 40 in the conveyance direction XA is preferably equal to a supply speed of the separation member 30 above the prepreg 40. The speeds can be adjusted to be the same by adjusting the conveyance speed of the prepreg 40 conveyed by the conveyance rollers 20 and the supply speed of the separation member 30 determined by the separation member supply section 32.

As a result of the conveyance speed of the prepreg 40 and the supply speed of the separation member 30 coinciding with each other, the lower surface of the separation member 30 and the upper surface of the prepreg 40 are prevented from rubbing with each other in the conveyance of the prepreg 40. The structure makes it possible to mark a boundary between the stacks each of the certain number of prepregs 40 without scratching and deforming the prepregs 40.

The separation member supply section 32 may be a mechanism that takes the separation members 30 placed on the supporting plate 31 one by one, and supplies the separation member 30 toward the top of prepregs 40 stacked on the stacking unit 26.

In the embodiment, the separation member supply section 32 includes a drive section 34 and a forming section 33.

Figure 4A:
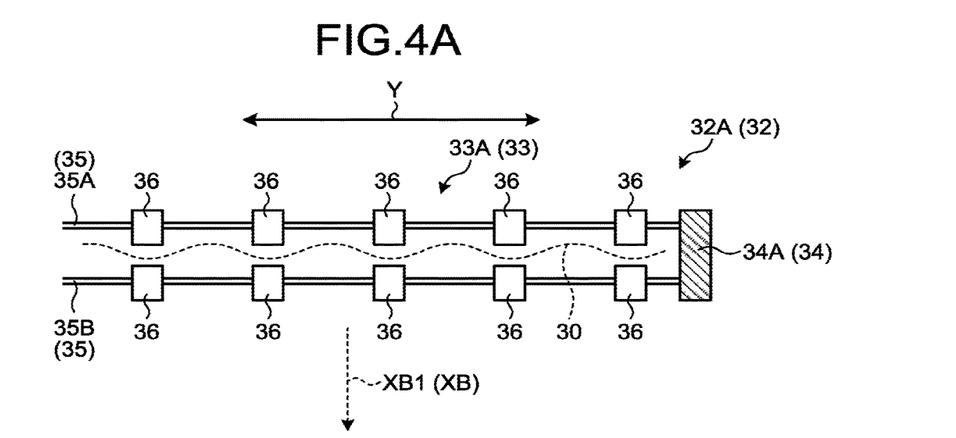
FIGS. 4A to 4C are exemplary schematic diagrams of a separation member supply section.
Figure 4B:
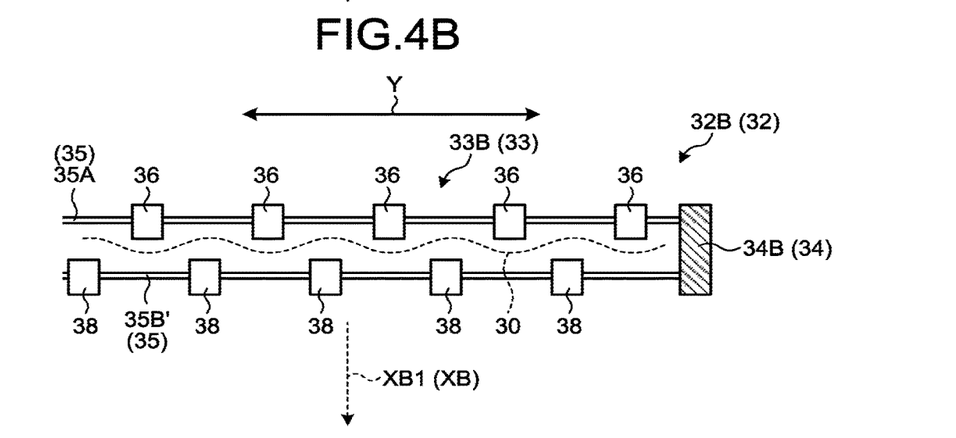
Figure 4C:
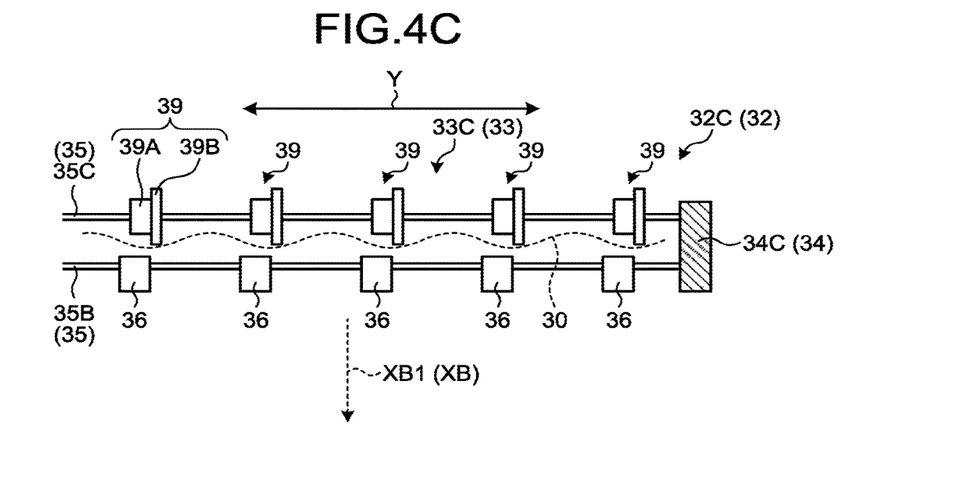

FIGS. 4A to 4C are exemplary schematic diagrams illustrating examples of the separation member supply section 32. Specifically, FIG. 4A illustrates a separation member supply section 32A, FIG. 4B illustrates a separation member supply section 32B, and FIG. 4C illustrates a separation member supply section 32C.

FIG. 4A is a schematic diagram of the separation member supply section 32A. The separation member supply section 32A includes a forming section 33A and a drive section 34A. The forming section 33A is an example of the forming section 33 while the drive section 34A is an example of the drive section 34.

The forming section 33A forms a crease on the separation member 30. Examples of the crease may include a folding line generated by completely folding the separation member 30, and a long region corresponding to the bottom of a valley and a long region corresponding to the top of a ridge generated by bending the separation member 30.

Figure 5A:
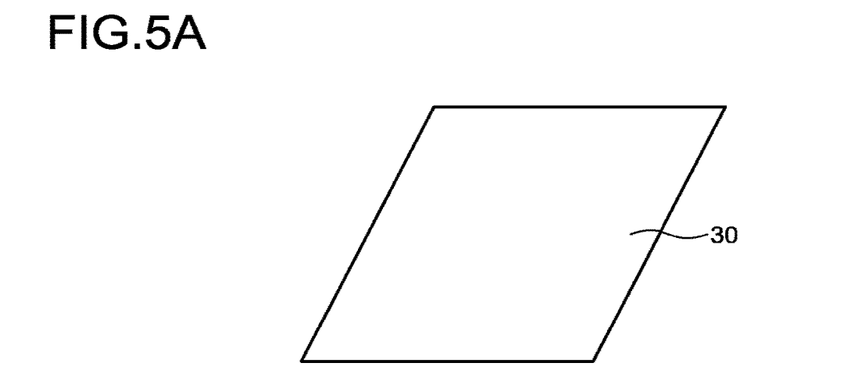
FIGS. 5A and 5B are explanatory views of forming creases on a separation member.
Figure 5B:
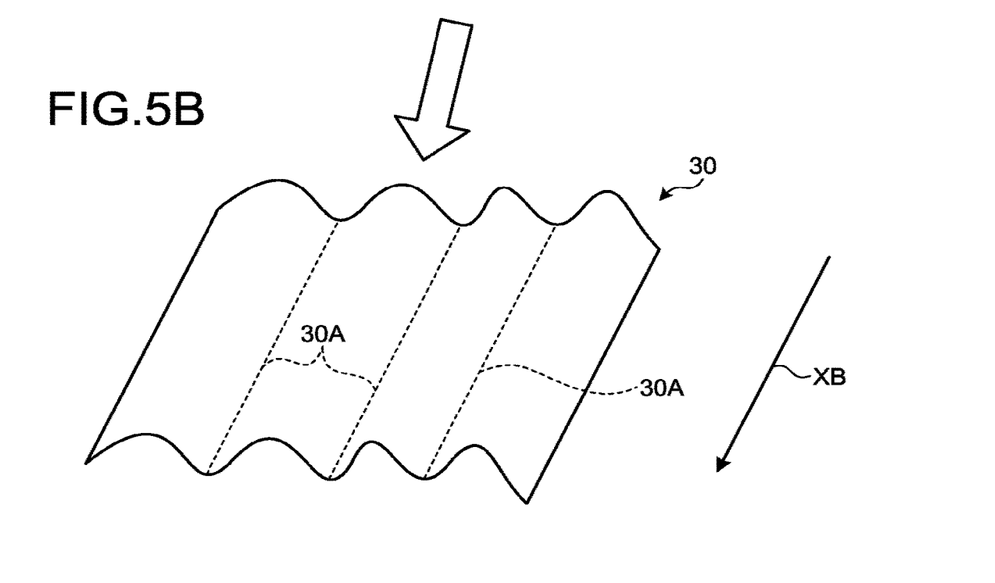

FIGS. 5A and 5B are explanatory views of forming the creases on the separation member 30. The forming section 33A forms creases 30A (refer to FIG. 5B) on the separation member 30 having no creases as illustrated in FIG. 5A, for example. The direction of the crease 30A coincides with the supply direction XB of the separation member 30 to the prepreg 40. The direction of the crease 30A is the long direction of the crease 30A. In other words, when the folding line is formed by the crease 30A, the direction of the crease 30A is the long direction of the folding line.

The forming section 33A may form the single crease 30A or a plurality of creases 30A on the separation member 30. When the forming section 33A forms the multiple creases 30A on the separation member 30, the creases 30A are preferably formed in parallel with one another. In this case, each direction (the long direction of the crease 30A) of the multiple creases 30A preferably coincides with the supply direction XB.

Referring back to FIG. 4A, the forming section 33A includes a pair of shaft members 35. The shaft members 35 are composed of a shaft member 35A and a shaft member 35B. The shaft members 35 (the shaft member 35A and the shaft member 35B) are rod-shaped members that extend in the direction (the Y direction indicated with the arrow) perpendicular to the supply direction XB1. The shaft member 35A and the shaft member 35B are supported in parallel with each other with a certain distance therebetween.

The shaft members 35 (the shaft member 35A and the shaft member 35B) are each provided with a plurality of rollers 36 with a certain distance therebetween along the long direction (the Y direction indicated with the arrow) of the corresponding shaft member 35. The roller 36 is a member having a ring-like shape. In the example illustrated in FIG. 4A, the rollers 36 provided to the shaft member 35A and the rollers 36 provided to the shaft member 35B are arranged one to one in correspondence with each other at the same position in the long direction (the Y direction indicated with the arrow) of the shaft members 35.

The separation member 30 passes through a space between the shaft member 35A and the shaft member 35B. The distance between the shaft member 35A and the shaft member 35B may be preliminarily adjusted to a distance that allows the creases 30A to be formed by the rollers 36 on the separation member 30 and the separation member 30 having the creases 30A to be supplied in the supply direction XB1.

One end in the long direction (the Y direction indicated with the arrow) of each of the shaft member 35A and the shaft member 35B is supported by the drive section 34A. The drive section 34A drives the shaft member 35A and the shaft member 35B to rotate in opposite directions to each other. The rotation axis of the shaft member 35A extends in the long direction (the Y direction indicated with the arrow) of the shaft member 35A while the rotation axis of the shaft member 35B extends in the long direction (the Y direction indicated with the arrow) of the shaft member 35B. With the rotation of the shaft member 35A and the shaft member 35B, the separation member 30 is conveyed in the space between the shaft member 35A and the shaft member 35B while being pinched. As a result, the creases 30A are formed on the separation member 30 by the rollers 36.

The structure of the separation member supply section 32A is, however, not limited to the structure illustrated in FIG. 4A. The separation member supply section 32 may have another structure such as the separation member supply section 32B illustrated in FIG. 4B or the separation member supply section 32C illustrated in FIG. 4C, for example.

FIG. 4B is a schematic diagram of the separation member supply section 32B. The separation member supply section 32B includes a forming section 33B and a drive section 34B. The forming section 33B is an example of the forming section 33 while the drive section 34B is an example of the drive section 34.

The forming section 33B includes the shaft member 35A and a shaft member 35B' serving as the pair of shaft members 35. The shaft member 35B' is a rod-shaped member that extends in the direction (the Y direction indicated with the arrow) perpendicular to the supply direction XB1. The shaft member 35A and the shaft member 35B' are supported in parallel with each other with a certain distance therebetween.

The forming section 33B has the same structure as the forming section 33A except for that the forming section 33B includes the shaft member 35B' instead of the shaft member 35B. The shaft member 35B' is provided with a plurality of rollers 38 with a certain distance therebetween along the long direction (the Y direction indicated with the arrow) of the corresponding shaft member 35. The roller 38 has the same structure as the roller 36. In the forming section 33B, the rollers 36 provided to the shaft member 35A and the rollers 38 provided to the shaft member 35B' are arranged in such a manner that the positions of the rollers 36 and 38 in the long direction (the Y direction indicated with the arrow) of the shaft members 35 differ from one another. Except for that arrangement, the forming section 33B has the same structure as the forming section 33A.

The drive section 34B supports one end in the long direction (the Y direction indicated with the arrow) of each of the shaft member 35A and the shaft member 35B'. The drive section 34B drives the shaft member 35A and the shaft member 35B' to rotate in opposite directions to each other. The rotation axis of the shaft member 35A extends in the long direction (the Y direction indicated with the arrow) of the shaft member 35A while the rotation axis of the shaft member 35B' extends in the long direction (the Y direction indicated with the arrow) of the shaft member 35B'. With the rotation of the shaft member 35A and the shaft member 35B', the separation member 30 is conveyed in the space between the shaft member 35A and the shaft member 35B'. As a result, the creases 30A are formed on the separation member 30 by the rollers 36 and 38.

FIG. 4C is a schematic diagram of the separation member supply section 32C. The separation member supply section 32C includes a forming section 33C and a drive section 34C. The forming section 33C is an example of the forming section 33 while the drive section 34C is an example of the drive section 34.

The forming section 33C includes a shaft member 35C and the shaft member 35B serving as the pair of shaft members 35. The shaft member 35C is a rod-shaped member that extends in the direction (the Y direction indicated with the arrow) perpendicular to the supply direction XB1. The shaft member 35C and the shaft member 35B are supported in parallel with each other with a certain distance therebetween.

The forming section 33C has the same structure as the forming section 33A except for that the forming section 33C includes the shaft member 35C instead of the shaft member 35A. The shaft member 35C is provided with a plurality of rollers 39 with a certain distance therebetween along the long direction (the Y direction indicated with the arrow) of the corresponding shaft member 35. The roller 39 includes a first roller 39A having a ring-like shape and a second roller 39B having an outer diameter larger than that of the first roller 39A. The width (the length in the Y direction indicated with the arrow) of the outer periphery of the second roller 39B is preferably smaller than that of the first roller 39A. The second roller 39B is a member that has a ring-like shape and is provided along the circumference of the outer periphery of the first roller 39A at one end in the long direction (the Y direction indicated with the arrow) of the corresponding shaft member 35. The first roller 39A and the second roller 39B may be integrated.

In the forming section 33C, the first rollers 39A provided to the shaft member 35C and the rollers 36 provided to the shaft member 35B are arranged in one to one correspondence with each other at the same position in the long direction (the Y direction indicated with the arrow) of the shaft members 35.

The drive section 34C supports one end in the long direction (the Y direction indicated with the arrow) of each of the shaft member 35C and the shaft member 35B. The drive section 34C drives the shaft member 35C and the shaft member 35B to rotate in opposite directions to each other. The rotation axis of the shaft member 35C extends in the long direction (the Y direction indicated with the arrow) of the shaft member 35C while the rotation axis of the shaft member 35B extends in the long direction (the Y direction indicated with the arrow) of the shaft member 35B. With the rotation of the shaft member 35C and the shaft member 35B, the separation member 30 is conveyed in the space between the shaft member 35C and the shaft member 35B. As a result, the creases 30A are formed on the separation member 30 by the rollers 39 and 36.

The number of creases 30A formed on the separation member 30 can be adjusted by adjusting the number of rollers 36 (or the number of rollers 38 or the number of rollers 39) provided to the forming section 33. The positions of the creases 30A formed on the separation member 30 can be adjusted by adjusting the positions of the rollers 36 (or the rollers 38 or the rollers 39) provided to the forming section 33.

The forming section 33, which has the structure as described above, included in the separation member supply section 32 forms the creases 30A on the separation member 30. As described above with reference to FIGS. 5A and 5B, the single or multiple creases 30A are formed along the supply direction XB (the supply direction XB1) on the separation member 30.

With the rotation of the shaft members 35 driven by the drive section 34 (the drive section 34A, the drive section 34B, or the drive section 34C), the separation member 30 having the creases 30A formed by the forming section 33 is released from the separation member supply section 32 and supplied toward above the prepreg 40.

The supply speed of the separation member 30 can be adjusted by one of or the combination of multiple of the following items: a type (material, thickness, size, weight, and shape) of the separation member 30, the number of creases 30A formed on the separation member 30, a distance between the creases 30A when the multiple creases 30A are formed, and rotation speed of the shaft members 35.

In the embodiment, the supply speed is preferably adjusted by the separation member supply section 32 such that separation member 30 is placed on the top of the prepregs 40 stacked on the stacking unit 26 in surface contact with the prepreg 40.

Figure 6:
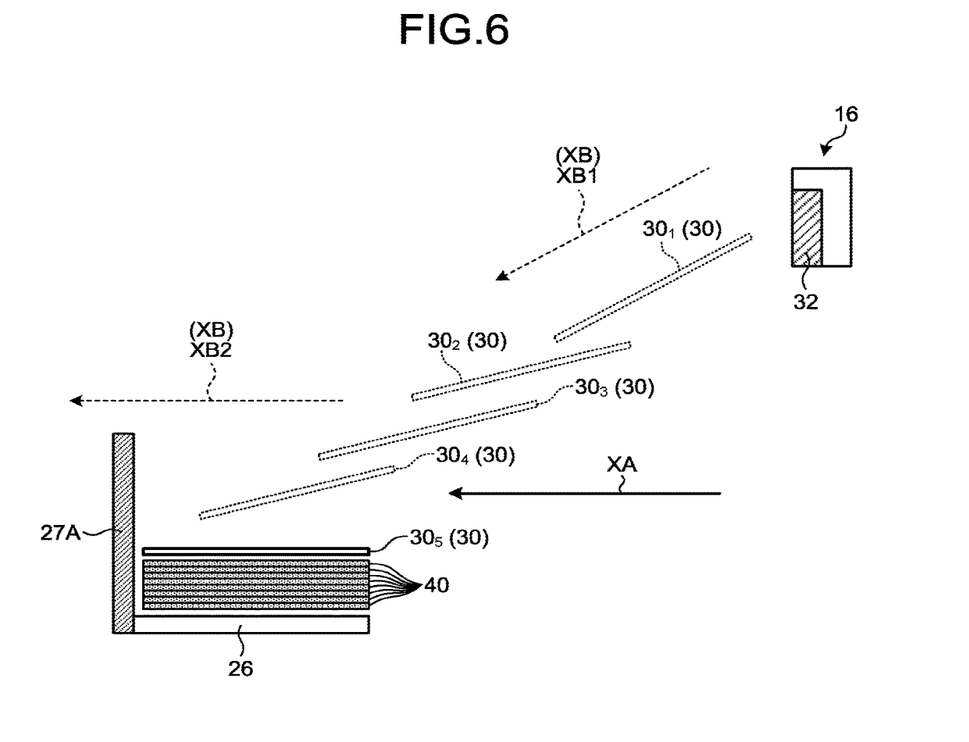
FIG. 6 is an explanatory view of supply of the separation member.

FIG. 6 is an explanatory view of supply of the separation member 30.

The separation member 30 supplied from the separation member supply unit 16 by the separation member supply section 32 is supplied while falling downwards by the gravitational effect (refer to a separation member $30_1$, a separation member $30_2$, a separation member $30_3$, and the supply direction XB1). The separation member 30 is supplied in substantially horizontal direction above the top of the prepregs 40 due to air resistance (refer to a separation member $30_4$, and the supply direction XB2 of the separation member 30), and thereafter is placed on the prepreg 40 in such a manner that the lower surface of the separation member 30 and the upper surface of the prepreg 40 stacked at the uppermost position of the stacked prepregs 40 are in surface contact with each other (refer to a separation member $30_5$).

The stacking apparatus 1 in the embodiment, thus, can stack the separation member 30 in surface contact with the surface of the prepreg 40 without scratching the surface of the prepreg 40.

When the prepreg 40 is used for the sheet for circuit board, the circuit board manufactured using the scratched sheet for circuit board causes a deterioration of a characteristic such as a resistance value. The stacking apparatus 1 in the embodiment can provide a sheet separation apparatus that can easily separate the sheets for circuit board without deterioration in quality of the sheets for circuit board (without scratching the sheets for circuit board). The sheet separation apparatus, thus, can prevent the occurrence of such a failure of the circuit board. This effect solves such a technical problem unique to the sheets for circuit board.

Referring back to FIG. 1, the following describes the control unit 18. The control unit 18 controls the respective units of the stacking apparatus 1.

In the embodiment, the control unit 18 controls the conveyance rollers 20 so as to control the conveyance of the prepreg 40. The control unit 18 receives the prepreg detection signal from the sensor 22. The control unit 18 counts the prepreg detection signals so as to count the number of prepregs 40 discharged to the discharge unit 14.

The control unit 18 controls the separation member supply section 32 of the separation member supply unit 16 such that the separation member supply section 32 supplies the separation member 30 onto the top of the stacked prepregs 40 for every stacking of the certain number of prepregs 40 on the stacking unit 26. The control causes the separation member 30 to be stacked on the prepreg 40 for every certain number of prepregs 40. The control unit 18 may preliminarily store the certain number. The certain number may be appropriately changeable by the user's operation instruction, for example.

In the stacking apparatus 1, the position and the angle of the separation member supply section 32 relative to the placement position are preliminarily adjusted in accordance with the type of the separation member 30, the number of creases 30A and the distance between the creases 30A on the separation member 30, for example, such that the separation member 30 supplied from the separation member supply section 32 is placed on the prepreg 40 at a target position (in the embodiment, above the stacking unit 26) in surface contact with the prepreg 40. The control unit 18 controls the drive section 34 to adjust the supply speed such that the separation member 30 supplied from the separation member supply section 32 is placed on the prepreg 40 at a target position (in the embodiment, above the stacking unit 26) in surface contact with the prepreg 40.

Figure 7:
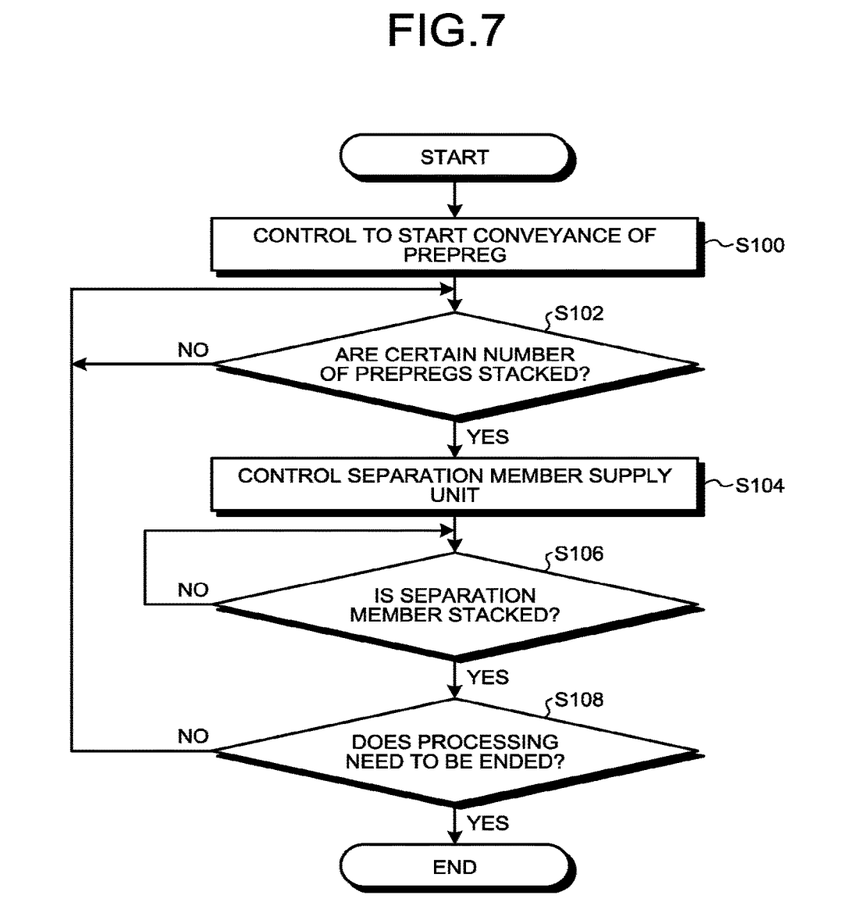
FIG. 7 is a flowchart illustrating an exemplary procedure of stacking process.

FIG. 7 is a flowchart illustrating an exemplary procedure of stacking process performed by the control unit 18. The control unit 18 controls the conveyance unit 12 such that the conveyance unit 12 starts the conveyance of the prepreg 40

(step S100). The control unit 18 controls the conveyance rollers 20 of the conveyance unit 12 such that the conveyance rollers 20 start the conveyance of the prepreg 40. In the processing at step S100, the conveyance rollers 20 start the conveyance of the prepreg 40 supplied from the supply unit 10.

The control unit 18 determines whether the certain number of prepregs 40 are stacked (step S102). At step S102, the control unit 18 counts the prepreg detection signals received from the sensor 22 after the latest supply of the separation member 30. The control unit 18, thus, counts the number of prepregs 40 stacked on the separation member 30 after the latest supply of the separation member 30. The control unit 18 performs the determination at step S102 by determining whether the count value is the certain number.

If the negative determination is made at step S102 (No at step S102), the processing returns to step S102. If the positive determination is made at step S102 (Yes at step S102), the processing proceeds to step S104.

At step S104, the control unit 18 controls the separation member supply section 32 of the separation member supply unit 16 such that the separation member supply section 32 supplies the separation member 30 (step S104). Specifically, the control unit 18 controls the drive section 34 of the separation member supply section 32 such that a single separation member 30 is supplied on the prepreg 40.

The control unit 18 determines whether the separation member 30 is stacked on the prepreg 40 (step S106). The control unit 18 performs the determination at step S106 by determining whether a preset setting time has elapsed after the control at step S104, for example. For example, a time necessary for the separation member 30 to be supplied from the separation member supply section 32 to the prepreg 40 may be preliminarily measured, and the measured time may be used for the setting time. Alternatively, a sensor that detects the stacking of the separation member 30 on the prepreg 40 may be provided to the discharge unit 14. In this case, the control unit 18 may determine that the separation member 30 is stacked on the prepreg 40 when the sensor detects the stacking of the separation member 30.

The control unit 18 repeats the negative determination (No at step S106) until the positive determination (Yes at step S106) is made at step S106. If the positive determination is made at step S106 (Yes at step S106), the processing proceeds to step S108.

At step S108, the control unit 18 determines whether the stacking process needs to be ended (step S108). For example, the control unit 18 determines that the stacking process needs to be ended when no new prepreg detection signal is received in a time period equal to or larger than a certain time period after the latest receiving of the prepreg detection signal. Examples of the case where the prepreg detection signal is not received in a time period equal to or larger than a certain time period include a case where an abnormality occurs in conveyance in the conveyance unit 12 and a case where the supply of the prepreg 40 from the supply unit 10 ends.

If the negative determination is made at step S108 (No at step S108), the processing returns to step S102. If the positive determination is made at step S108 (Yes at step S108), this routine ends.

As a result of the stacking process performed from step S100 to step S108, the separation member 30 is stacked for every stacking of the certain number of prepregs 40. The separation members 30, thus, make it possible to mark a boundary between the stacks each of the certain number of prepregs 40.

As described above, the stacking apparatus 1 in the embodiment includes the conveyance unit 12 and the separation member supply section 32. The conveyance unit 12 stacks the prepregs 40 (sheets for circuit board) on the stacking unit 26. The separation member supply section 32 supplies the separation member 30 onto the prepreg 40 (sheet for circuit board).

The stacking apparatus 1 in the embodiment stacks the separation member 30 on the prepreg 40 by supplying the separation member 30, as described above. The stacking apparatus 1 in the embodiment, thus, can mark a boundary between the stacks each of the certain number of prepregs (sheets for circuit board) by the separation member 60 without scratching or deforming the prepregs 40.

The separation member 30 differs from the prepreg 40 (sheet for circuit board) in at least one of a thickness, a size, a color, or a material.

The separation member 30 may have a color different from that of the prepreg 40 (sheet for circuit board). The separation member 30 may have the same material as the prepreg 40 (sheet for circuit board). At least one width of the separation member 30 is preferably equal to at least one width of the prepreg 40 (sheet for circuit board). The separation member 30 may have a thickness smaller than that of the prepreg 40 (sheet for circuit board). The separation member 30 may be dust-free paper.

The separation member supply section 32 may include the forming section 33 that forms the crease 30A on the separation member 30. The direction of the crease 30A preferably coincides with the supply direction XB of the separation member 30 to the prepreg 40 (sheet for circuit board). The forming section 33A may form the multiple creases 30A in parallel with one another on the separation member 30.

The conveyance direction XA of the prepreg 40 (sheet for circuit board) preferably coincides with the supply direction XB2 of the separation member 30. The separation member supply section 32 is preferably disposed on the upstream side of the stacking unit 26 in the conveyance direction XA of the prepreg 40 (sheet for circuit board).

The prepreg 40 (sheet for circuit board) has a sheet shape, for example. The prepreg 40 (sheet for circuit board) preferably has lower wear resistance than the separation member 30. The prepreg 40 (sheet for circuit board) preferably has higher ignitability than the separation member 30. The prepreg 40 is an example of the sheet for circuit board.

In the embodiment, the separation member supply section 32 is disposed on the upstream side of the stacking unit 26 included in the discharge unit 14 in the conveyance direction XA of the prepreg 40. The separation member supply section 32 may be disposed above (at an upper position in the vertical direction from) the stacking unit 26. In this case, the separation member supply section 32 may supply the separation member 30 on the prepreg 40 using the force of gravity by dropping the separation member 30 toward the prepreg 40.

In the embodiment, the separation member supply section 32 stacks the separation member 30 on the prepreg 40 by supplying the separation member 30 onto the top of the prepregs 40 stacked on the stacking unit 26 included in the discharge unit 14. The position where the separation member 30 is stacked on the prepreg 40 is not limited to the position above the stacking unit 26 included in the discharge unit 14.

For example, the separation member supply section 32 places the separation member 30 on the prepreg 40 in being conveyed by the conveyance unit 12. Specifically, the separation member supply section 32 may supply the separation member 30 onto the prepreg 40 held on the conveyance belt 21 of the conveyance unit 12. In this case, the separation member supply section 32 may be disposed above the conveyance path L in the conveyance unit 12.

The separation member supply section 32 supplies the separation member 30 from the same direction as the direction (the XA direction indicated with the arrow) in which the prepreg 40 is conveyed by the conveyance unit 12 and places the separation member 30 on the prepreg 40 in being conveyed.

The separation member supply section 32, thus, can supply the separation member 30 on the prepreg 40 in being conveyed before the prepreg 40 is stacked on the stacking unit 26.

In this case, the separation member 30 placed on the prepreg 40 is conveyed together with the prepreg 40. The lower surface of the separation member 30 and the upper surface of the prepreg 40 are, thus, prevented from rubbing with each other in the conveyance of the prepreg 40. The structure makes it possible to mark a boundary between the stacks each of the certain number of prepregs 40 without scratching and deforming the prepregs 40.

In this case, the separation member supply section 32 preferably supplies the separation member 30 on prepreg 40 at the same speed as the prepreg 40 in being conveyed by the conveyance unit 12, and places the separation member 30 on the prepreg 40.

The prepreg 40 on which the separation member 30 is placed in the conveyance by the conveyance belt 21 is conveyed in the conveyance direction XA by the conveyance belt 21, and discharged to the discharge unit 14. In this case, the layered body in which the separation member 30 is placed on the prepreg 40 is discharged to the discharge unit 14 from the conveyance unit 12.

When the separation member supply section 32 is disposed above the conveyance path L in the conveyance unit 12, the position where the separation member 30 supplied by the separation member supply section 32 is stacked on the prepreg 40 is preferably a position as close to the end of the conveyance unit 12 on the downstream side in the conveyance direction XA as possible, and most preferably, a position at the end of the conveyance unit 12 on the downstream side. As the position where the separation member 30 is stacked on the prepreg 40 is closer to the end of the conveyance unit 12 on the downstream side in the conveyance direction XA, the length of the conveyance path L in which only the prepreg 40 is conveyed can be maintained longer.

Figure 8:
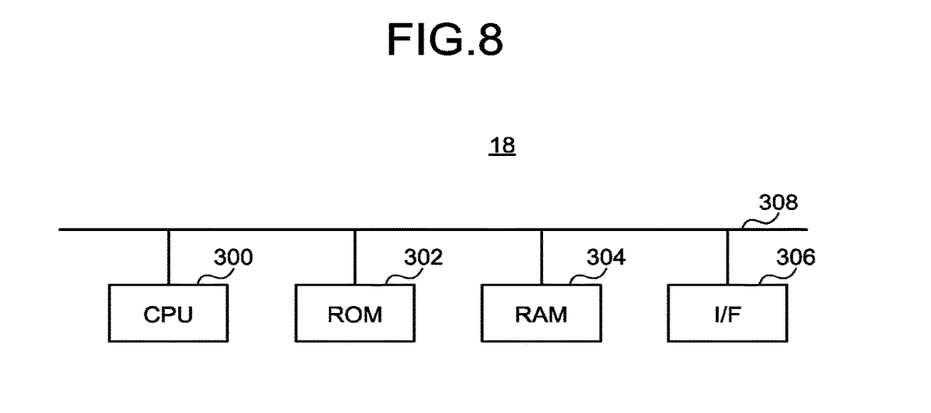
FIG. 8 is a hardware structure diagram of a control unit.

The following describes an exemplary hardware structure of the control unit 18 of the stacking apparatus 1. FIG. 8 is a hardware structure diagram of the control unit 18. The control unit 18 includes a central processing unit (CPU) 300, a read only memory (ROM) 302, a random access memory (RAM) 304, and an interface (I/F) 306. The CPU 300, the ROM 302, the RAM 304, and the I/F 306 are connected to one another with a bus 308. The hardware is achieved using a typical computer.

The program to achieve the stacking process executed by the control unit 18 of the stacking apparatus 1 in the embodiment is embedded and provided in the ROM 302, for example.

The program to achieve the stacking process executed by the control unit 18 of the stacking apparatus 1 in the embodiment may be recorded and provided on a computer-readable recording medium such as a compact disc read only memory (CD-ROM), a flexible disk (FD), a compact disc recordable (CD-R), and a digital versatile disc (DVD), as an installable or executable file.

The program to achieve the stacking process executed by the control unit 18 of the stacking apparatus 1 in the embodiment may be stored in a computer connected to a network such as the Internet, and be provided by being downloaded through the network. The program to achieve the stacking process executed by the control unit 18 of the stacking apparatus 1 in the embodiment may be provided or delivered through a network such as the Internet.

The program to achieve the stacking process executed by the control unit 18 of the stacking apparatus 1 in the embodiment has a module structure that includes the respective units described above. In practical hardware, the CPU 300 reads out the program from the storage medium such as the ROM 302 and executes the program, so that the respective units are stacked into a main storage unit, and the respective units are formed in the main storage unit.

According to the present invention, it is possible to mark a boundary between the stacks each of the certain number of sheets for circuit board without scratching and deforming the sheets.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

What is claimed is:

1. A stacking apparatus, comprising:
a conveyance unit that conveys circuit board sheets;
a stacking unit that stacks the circuit board sheets; and
a separation member supply unit that is disposed above the conveyance unit on an upstream side of the stacking unit in a conveyance direction, the separation member supply unit supplying a separation member to separate the stacked circuit board sheets at any position, wherein
the separation member supply unit supplies the separation member obliquely downward toward a circuit board sheet being conveyed by the conveyance unit in the conveyance direction and places the separation member on the circuit board sheet.

2. The stacking apparatus according to claim 1, wherein the separation member supply unit supplies the separation member before the circuit board sheet is stacked on the stacking unit.

3. The stacking apparatus according to claim 2, wherein the separation member supply unit supplies the separation member at the same speed as a speed of the circuit board sheet in being conveyed.

4. The stacking apparatus according to claim 1, wherein the separation member supply unit supplies the separation member at the same speed as a speed of the circuit board sheet being conveyed.

5. The stacking apparatus according to claim 1, wherein the separation member differs from the circuit board sheet in at least one of a thickness, a size, a color, or a material.

6. The stacking apparatus according to claim 1, wherein the separation member has a color different from a color of the circuit board sheet.

7. The stacking apparatus according to claim 1, wherein the separation member is made of the same material as a material of the circuit board sheet.

8. The stacking apparatus according to claim 1, wherein at least one width of the separation member is equal to at least one width of the circuit board sheet.

9. The stacking apparatus according to claim 1, wherein the separation member has a thickness smaller than a thickness of the circuit board sheet.

10. The stacking apparatus according to claim 1, wherein the separation member is dust-free paper.

11. The stacking apparatus according to claim 1, wherein the separation member supply unit includes a forming section that forms a crease on the separation member.

12. The stacking apparatus according to claim 11, wherein a direction of the crease coincides with a direction in which the separation member is supplied on the circuit board sheet.

13. The stacking apparatus according to claim 11, wherein the forming section forms a plurality of creases in parallel with one another on the separation member.

14. The stacking apparatus according to claim 1, wherein the separation member supply unit is disposed on an upstream side of the stacking unit in a conveyance direction of the circuit board sheet.

15. The stacking apparatus according to claim 1, wherein the circuit board sheet has lower wear resistance than the separation member.

16. The stacking apparatus according to claim 1, wherein the circuit board sheet is a prepreg material.

* * * * *